United States Patent
Fujimura

(10) Patent No.: US 12,108,529 B2
(45) Date of Patent: Oct. 1, 2024

(54) WIRING CIRCUIT BOARD

(71) Applicant: NITTO DENKO CORPORATION, Osaka (JP)

(72) Inventor: Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 245 days.

(21) Appl. No.: 17/798,810

(22) PCT Filed: Nov. 12, 2020

(86) PCT No.: PCT/JP2020/042346
§ 371 (c)(1),
(2) Date: Aug. 10, 2022

(87) PCT Pub. No.: WO2021/166340
PCT Pub. Date: Aug. 26, 2021

(65) Prior Publication Data
US 2023/0156914 A1     May 18, 2023

(30) Foreign Application Priority Data
Feb. 17, 2020 (JP) .................................. 2020-024024

(51) Int. Cl.
*H05K 1/02* (2006.01)
*G11B 5/48* (2006.01)
(Continued)

(52) U.S. Cl.
CPC ............. *H05K 1/111* (2013.01); *H05K 1/056* (2013.01); *H05K 2201/10083* (2013.01)

(58) Field of Classification Search
CPC ...... H05K 1/02; H05K 1/0271; H05K 1/0313; H05K 1/05; H05K 1/056; H05K 1/11;
(Continued)

(56) References Cited

U.S. PATENT DOCUMENTS

2007/0074899 A1* 4/2007 Aonuma ................... H05K 3/44
174/260
2007/0295534 A1 12/2007 Ishii et al.
(Continued)

FOREIGN PATENT DOCUMENTS

JP    2008-004756 A    1/2008
JP    2008-010646 A    1/2008
(Continued)

OTHER PUBLICATIONS

International Search Report issued in PCT/JP2020/042346 on Feb. 9, 2021.
(Continued)

*Primary Examiner* — Xiaoliang Chen
(74) *Attorney, Agent, or Firm* — Edwards Neils LLC; Jean C. Edwards, Esq.

(57) ABSTRACT

A suspension board with circuit including a first mounting region for mounting a slider and a second mounting region for mounting a piezoelectric element. The wiring circuit board includes a metal support layer, a base insulating layer, and a conductive layer. The conductive layer includes a first wiring pattern, a second wiring pattern, and a shield wiring pattern. The first wiring pattern includes a read wiring. The second wiring pattern includes a power supply wiring disposed at spaced intervals to the read wiring. The shield wiring pattern includes a shield wiring disposed between the read wiring and the power supply wiring.

4 Claims, 5 Drawing Sheets

(51) Int. Cl.
  *G11B 5/49* (2006.01)
  *H05K 1/05* (2006.01)
  *H05K 1/11* (2006.01)
  *H05K 3/28* (2006.01)
  *H05K 3/44* (2006.01)

(58) Field of Classification Search
  CPC ........ H05K 1/111; H05K 1/113; H05K 1/115;
    H05K 1/181; H05K 1/184; H05K 3/0023;
    H05K 3/28; H05K 3/44; H05K 3/188;
    H05K 3/341; H05K 3/3494; H05K
    3/4007; H05K 3/4038; H05K 3/4644;
    H05K 3/4685; H05K 2201/09045; H05K
    2201/10159; H05K 2201/10083; H05K
    2201/10545; H05K 2201/10121; H05K
    2203/0723; G11B 5/056; G11B 5/48;
    G11B 5/49; G11B 5/483; G11B 5/484;
    G11B 5/486; G11B 5/4833; G11B
    5/4853; G11B 5/4873; G11B 5/4826
  USPC ............... 361/767; 174/251, 260; 428/846.2;
    360/245.8, 294.4; 216/13, 20
  See application file for complete search history.

(56) References Cited

U.S. PATENT DOCUMENTS

| | | |
|---|---|---|
| 2008/0000673 A1 | 1/2008 | Ishii et al. |
| 2008/0247131 A1 | 10/2008 | Hitomi et al. |
| 2011/0318609 A1* | 12/2011 | Miura .................. H05K 3/4644 |
| | | 216/13 |
| 2012/0048609 A1* | 3/2012 | Ohnuki .................. H05K 1/184 |
| | | 216/13 |
| 2014/0160599 A1* | 6/2014 | Higuchi ................. G11B 5/486 |
| | | 360/294.4 |
| 2016/0105954 A1* | 4/2016 | Sugimoto ............ G11B 5/4853 |
| | | 174/251 |
| 2016/0234936 A1 | 8/2016 | Okuno et al. |
| 2017/0042024 A1* | 2/2017 | Sugimoto ............. H05K 1/113 |
| 2017/0164470 A1* | 6/2017 | Fujimura ............... H05K 1/056 |
| 2018/0070448 A1 | 3/2018 | Sakakura et al. |
| 2018/0358037 A1* | 12/2018 | Fujimura ............. H05K 3/4007 |

FOREIGN PATENT DOCUMENTS

| | | |
|---|---|---|
| JP | 2008-276922 A | 11/2008 |
| JP | 2016-103305 A | 6/2016 |
| JP | 2018-041520 A | 3/2018 |

OTHER PUBLICATIONS

Written Opinion issued in PCT/JP2020/042346 on Feb. 9, 2021.
Office Action, which was issued by the Japanese Patent Office on Feb. 6, 2024, in connection with Japanese Patent Application No. 2020-024024.
International Preliminary Report on Patentability issued by WIPO on Aug. 23, 2022, in connection with International Patent Application No. PCT/JP2020/042346.

* cited by examiner

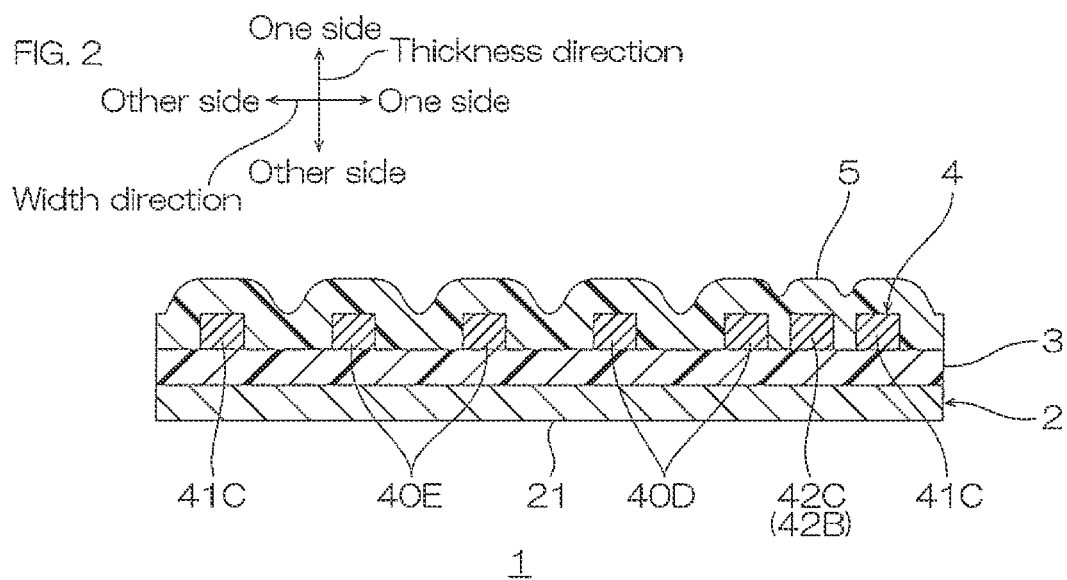

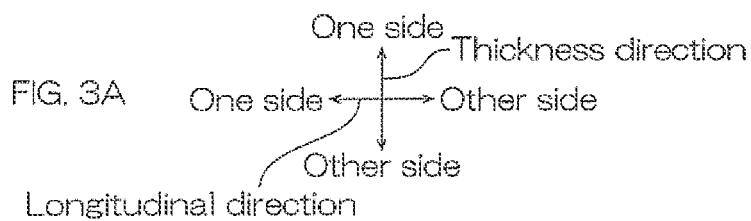
FIG. 3A
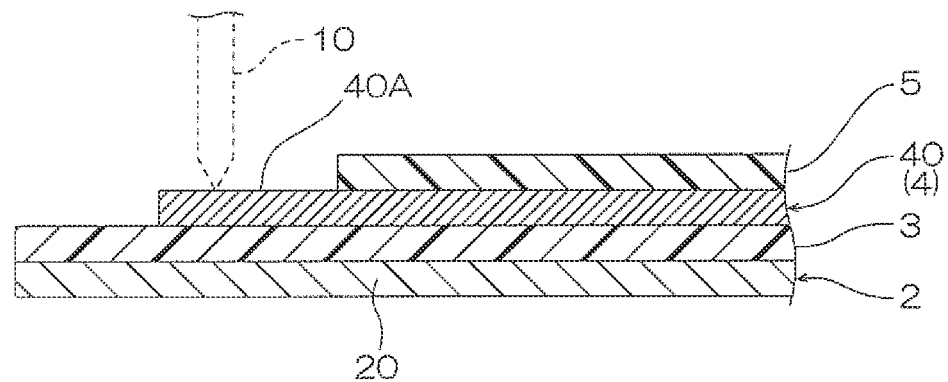
FIG. 3B
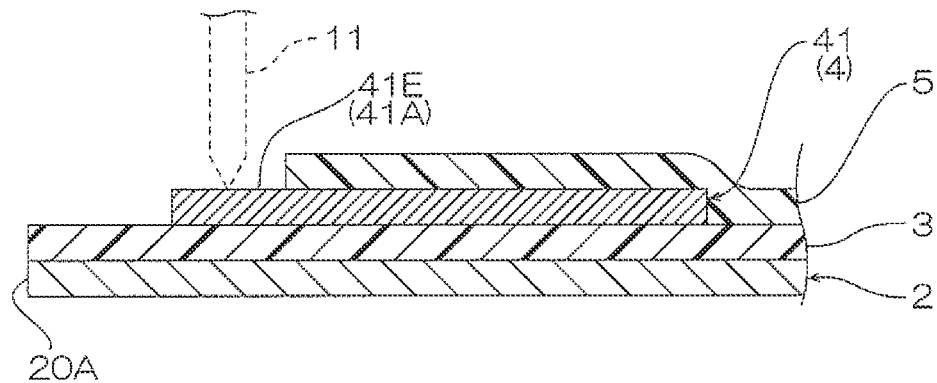
FIG. 3C
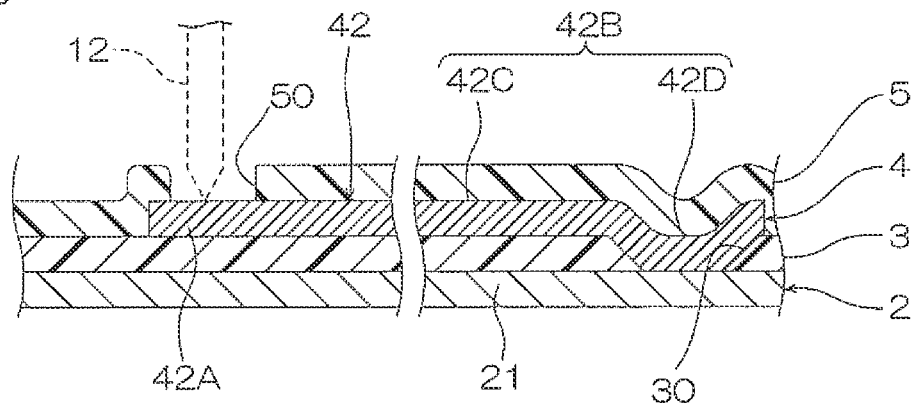

WIRING CIRCUIT BOARD

CROSS-REFERENCE TO RELATED APPLICATIONS

The present application is a 35 U.S.C. 371 National Stage Entry of for PCT/JP2020/042346, filed on Nov. 12, 2020, which claims priority from Japanese Patent Application No. 2020-024024, filed on Feb. 17, 2020, the contents of all of which are herein incorporated by reference in their entirety.

TECHNICAL FIELD

The present invention relates to a wiring circuit board.

BACKGROUND ART

The wiring circuit board is used for various industrial products such as electronic and electrical devices. As such a wiring circuit board, for example, a suspension board with circuit on which a slider including a magnetic head, and a piezoelectric element for displacing the slider are mounted has been known.

For example, a suspension board with circuit including a support board, a base insulating layer, and a conductive pattern in order in a thickness direction of the support board, and in which the conductive pattern includes a magnetic head terminal electrically connected to a magnetic head, a signal wiring connected to the magnetic head terminal, a first terminal electrically connected to a piezoelectric element, and a power supply wiring connected to the first terminal; and the signal wiring and the power supply wiring are adjacent to each other has been proposed (ref: for example, Patent Document 1).

CITATION LIST

Patent Document

Patent Document 1: Japanese Unexamined Patent Publication No. 2018-41520

SUMMARY OF THE INVENTION

Problem to be Solved by the Invention

However, in the suspension board with circuit described in Patent Document 1, there is a case where the power supply wiring which is electrically connected to the piezoelectric element is charged, and the power supply wiring and the signal wiring are short-circuited.

The present invention provides a wiring circuit board which is capable of suppressing a short circuit between a first wiring and a second wiring.

Means for Solving the Problem

The present invention [1] includes a wiring circuit board including a first mounting region for mounting a first electronic element and a second mounting region for mounting a second electronic element, the wiring circuit board including a metal support layer, a base insulating layer disposed at one side in a thickness direction of the metal support layer, and a conductive layer disposed at one side in the thickness direction of the base insulating layer, wherein the conductive layer includes a first wiring pattern having a first terminal disposed inside or adjacent to the first mounting region, and a first wiring connected to the first terminal; a second wiring pattern having a second terminal disposed inside or adjacent to the second mounting region, and a second wiring connected to the second terminal and disposed at spaced intervals to the first wiring; and a shield wiring pattern electrically connected to the metal support layer, and the shield wiring pattern includes a shield wiring disposed between the first wiring and the second wiring.

According to such a configuration, the shield wiring pattern is electrically connected to the metal support layer, and the shield wiring provided in the shield wiring pattern is disposed between the first wiring and the second wiring. Therefore, even when the first wiring and/or the second wiring are/is charged, it is possible to suppress a short circuit between the first wiring and the second wiring.

The present invention [2] includes the wiring circuit board described in the above-described [1], wherein the shield wiring pattern has an inspection terminal for continuity inspection, and a ground connecting portion electrically connected to the metal support layer.

However, when the shield wiring pattern is provided in the wiring circuit board, it is desirable that the continuity inspection is carried out in order to inspect a formation failure of the shield wiring pattern.

According to the above-described configuration, the shield wiring pattern has the inspection terminal and the ground connecting portion. Therefore, it is possible to bring a probe into contact with the inspection terminal, and carry out the continuity inspection of the shield wiring pattern.

The present invention [3] includes the wiring circuit board described in the above-described [2], wherein at least one of the inspection terminal and the ground connecting portion is located in an end portion of the shield wiring.

According to such a configuration, since at least one of the inspection terminal and the ground connecting portion is located in the end portion of the shield wiring, it is possible to further more surely inspect the formation failure of the shield wiring pattern by the continuity inspection of the shield wiring pattern.

The present invention [4] includes the wiring circuit board described in the above-described [2] or [3] further including a cover insulating layer disposed at one side in the thickness direction of the base insulating layer and covering the conductive layer, wherein the first terminal, the second terminal, and the inspection terminal are exposed from the cover insulating layer.

According to such a configuration, since the first terminal, the second terminal, and the inspection terminal are exposed from the cover insulating layer, it is possible to bring the probe into contact with each of the first terminal, the second terminal, and the inspection terminal from one side in the thickness direction. Therefore, it is possible to collectively carry out the continuity inspection of the first wiring pattern, the second wiring pattern, and the shield wiring pattern.

Effect of the Invention

According to the wiring circuit board of the present invention, it is possible to suppress a short circuit between a first wiring and a second wiring.

BRIEF DESCRIPTION OF THE DRAWINGS

FIG. 2 shows an A-A cross-sectional view of the suspension board with circuit shown in FIG. 1.

FIG. 3A shows a B-B cross-sectional view of the suspension board with circuit shown in FIG. 1.

FIG. 3B shows a C-C cross-sectional view of the suspension board with circuit shown in FIG. 1.

FIG. 3C shows a D-D cross-sectional view of the suspension board with circuit shown in FIG. 1.

DESCRIPTION OF EMBODIMENTS

A suspension board with circuit 1 as a first embodiment of a wiring circuit board of the present invention is described with reference to FIGS. 1 to 3C.

Figure 1:
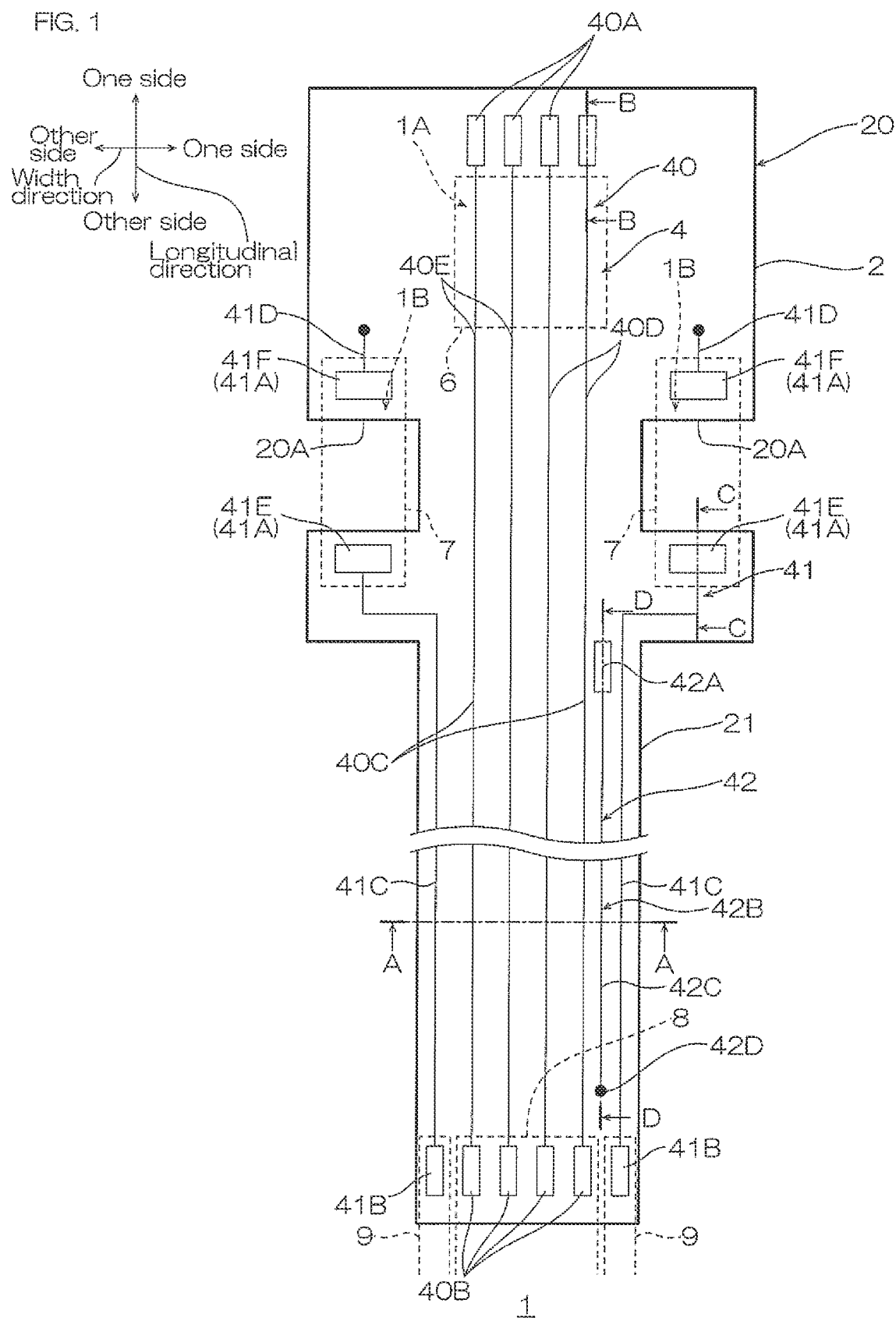
FIG. 1 shows a plan view of a suspension board with circuit as a first embodiment of a wiring circuit board of the present invention.

As shown in FIG. 1, the suspension board with circuit 1 has a generally flat belt shape extending in a predetermined direction.

In FIG. 1, a thickness direction on the plane of the sheet is a thickness direction (first direction) of the suspension board with circuit 1, a near side on the plane of the sheet is one side in the thickness direction (one side in the first direction), and a depth side on the plane of the sheet is the other side in the thickness direction (the other side in the first direction).

In FIG. 1, an up-down direction on the plane of the sheet is a longitudinal direction (second direction perpendicular to the first direction) of the suspension board with circuit 1, an upper side on the plane of the sheet is one side in the longitudinal direction (one side in the second direction), and a lower side on the plane of the sheet is the other side in the longitudinal direction (the other side in the second direction).

In FIG. 1, a right-left direction on the plane of the sheet is a width direction (third direction perpendicular to the first direction and the second direction) of the suspension board with circuit 1, a right side on the plane of the sheet is one side in the width direction (one side in the third direction), and a left side on the plane of the sheet is the other side in the width direction (the other side in the third direction). Specifically, directions are in conformity with direction arrows described in each view.

Further, in the following, the thickness direction of the suspension board with circuit 1 is simply referred to as the thickness direction, the longitudinal direction thereof is simply referred to as the longitudinal direction, and the width direction thereof is simply referred to as the width direction unless otherwise specified.

The suspension board with circuit 1 is capable of mounting a slider 6 as one example of a first electronic element and a plurality of (two) piezoelectric elements 7 as one example of a second electronic element. The suspension board with circuit 1 includes a first mounting region 1A and a plurality of (two) second mounting regions 1B.

The first mounting region 1A is a region for mounting the slider 6. The first mounting region 1A is located in one end portion of the suspension board with circuit 1 in the longitudinal direction. The first mounting region 1A is located between the plurality of (two) second mounting regions 1B in the width direction.

The plurality of (two) second mounting regions 1B are regions for mounting the piezoelectric element 7. The plurality of (two) second mounting regions 1B are located at the other side with respect to the first mounting region 1A in the longitudinal direction. The plurality of (two) second mounting regions 1B are located at spaced intervals to each other in the width direction.

As shown in FIG. 2, the suspension board with circuit 1 includes a metal support layer 2, a base insulating layer 3, a conductive layer 4, and a cover insulating layer 5 in order from the other side toward one side in the thickness direction.

1-1. Metal Support Layer

As shown in FIG. 1, the metal support layer 2 is a metal support for supporting the conductive layer 4, and extends in the longitudinal direction. In FIG. 1, for convenience, the metal support layer 2 and the conductive layer 4 are shown by a solid line, and the base insulating layer 3 and the cover insulating layer 5 are omitted.

The metal support layer 2 includes a stage 20 and a main body portion 21.

The stage 20 is located in one end portion of the metal support layer 2 in the longitudinal direction. The stage 20 is overlapped with the first mounting region 1A and the plurality of (two) second mounting regions 1B when viewed from the thickness direction. The stage 20 has an H-shape when viewed from the thickness direction. The stage 20 has two recessed portions 20A. The two recessed portions 20A are disposed at spaced intervals to each other in the width direction. The recessed portion 20A is overlapped with the second mounting region 1B when viewed from the thickness direction. The recessed portion 20A is recessed inwardly in the width direction from the end edge of the stage 20 in the width direction.

The main body portion 21 is a portion which is supported by a load beam (not shown). The main body portion 21 is located at the other side with respect to the stage 20 in the longitudinal direction. The main body portion 21 has a flat belt shape extending in the longitudinal direction. The main body portion 21 is continuous with the other end portion of the stage 20 in the longitudinal direction.

Examples of a material for the metal support layer 2 include metal materials such as stainless steel. A thickness of the metal support layer 2 is not particularly limited, and is, for example, 10 μm or more and 35 μm or less.

1-2. Base Insulating Layer

As shown in FIG. 2, the base insulating layer 3 is disposed at one side of the metal support layer 2 in the thickness direction, specifically, on one surface in the thickness direction of the metal support layer 2. The base insulating layer 3 has a predetermined pattern corresponding to the conductive layer 4. The base insulating layer 3 is located between the metal support layer 2 and the conductive layer 4 in the thickness direction.

As shown in FIG. 3C, the base insulating layer 3 includes a ground opening 30. The ground opening 30 is located in a portion located above the main body portion 21 in the base insulating layer 3. The ground opening 30 penetrates the base insulating layer 3 in the thickness direction. The ground opening 30 exposes one surface in the thickness direction of the main body portion 21 from the base insulating layer 3.

Examples of a material for the base insulating layer 3 include synthetic resins such as polyimide resin.

A thickness of the base insulating layer 3 is not particularly limited, and is, for example, 1 μm or more and 1000 μm or less.

1-3. Conductive Layer

As shown in FIG. 2, the conductive layer 4 is disposed at one side of the base insulating layer 3 in the thickness direction, specifically, on one surface in the thickness direction of the base insulating layer 3.

As shown in FIG. 1, the conductive layer 4 includes a first wiring pattern 40, a second wiring pattern 41, and a shield wiring pattern 42.

The first wiring pattern 40 includes a plurality of (four) slider connection terminals 40A as one example of a first terminal, a plurality of (four) external connection terminals 40B, and a plurality of (four) signal wirings 40C.

The plurality of (four) slider connection terminals 40A are electrically connected to the slider 6 via a bonding material (for example, solder etc.) when the slider 6 is mounted on the suspension board with circuit 1.

The plurality of slider connection terminals 40A are located in one end portion of the suspension board with circuit 1 in the longitudinal direction. In the present embodiment, the plurality of slider connection terminals 40A are disposed adjacent to the first mounting region 1A. More specifically, the plurality of slider connection terminals 40A are disposed adjacent to one side with respect to the first mounting region 1A in the longitudinal direction. The plurality of slider connection terminals 40A may be disposed inside the first mounting region 1A.

The plurality of slider connection terminals 40A are located at spaced intervals to each other in the width direction. The slider connection terminal 40A has a rectangular shape extending in the longitudinal direction.

The plurality of (four) external connection terminals 40B are electrically connected to an external board 8 in a state where the main body portion 21 is supported by a load beam (not shown).

The plurality of (four) external connection terminals 40B are located in the other end portion of the suspension board with circuit 1 in the longitudinal direction. The plurality of external connection terminals 40B are located at spaced intervals to each other in the width direction. The external connection terminal 40B has a rectangular shape extending in the longitudinal direction.

The plurality of (four) signal wirings 40C electrically connect the plurality of (four) slider connection terminals 40A to the plurality of (four) external connection terminals 40B. The plurality of (four) signal wirings 40C extend along the longitudinal direction, and are located at spaced intervals to each other in the width direction. The plurality of (four) signal wirings 40C pass between the two second mounting regions 1B in the width direction. The plurality of (four) signal wirings 40C include a plurality of (two) read wirings 40D as one example of a first wiring, and a plurality of (two) write wirings 40E.

The plurality of (two) read wirings 40D are connected to the plurality of (two) slider connection terminals 40A located at one side in the width direction among the plurality of (four) slider connection terminals 40A. Further, the plurality of (two) read wirings 40D are connected to the plurality of (two) external connection terminals 40B located at one side in the width direction among the plurality of (four) external connection terminals 40B.

The plurality of (two) read wirings 40D are located at one side in the width direction with respect to the plurality of (two) write wirings 40E. The two read wirings 40D constitute a first differential signal wiring pair transmitting a read signal. A first read signal is transmitted to one read wiring 40D, and a second read signal having an opposite phase to the first read signal is transmitted to the other read wiring 40D among the two read wirings 40D in a state where the slider connection terminal 40A is electrically connected to the slider 6, and the external connection terminal 40B is electrically connected to the external board 8.

The plurality of (two) write wirings 40E are connected to the plurality of (two) slider connection terminals 40A located at the other side in the width direction among the plurality of (four) slider connection terminals 40A. Further, the plurality of (two) write wirings 40E are connected to the plurality of (two) external connection terminals 40B located at the other side in the width direction among the plurality of (four) external connection terminals 40B.

The two write wirings 40E constitute a second differential signal wiring pair transmitting a write signal. A first write signal is transmitted to one write wiring 40E, and a second write signal having an opposite phase to the first write signal is transmitted to the other write wiring 40E among the two write wirings 40E in a state where the slider connection terminal 40A is electrically connected to the slider 6, and the external connection terminal 40B is electrically connected to the external board 8.

The second wiring pattern 41 includes a plurality of (four) element connection terminals 41A, a plurality of (two) power supply terminals 41B, a plurality of (two) power supply wirings 41C as one example of a second wiring, and a plurality of (two) ground wirings 41D.

The plurality of (four) element connection terminals 41A are electrically connected to the piezoelectric element 7 when the plurality of (two) piezoelectric elements 7 are mounted on the suspension board with circuit 1 via a bonding material (for example, solder etc.). The element connection terminal 41A has a rectangular shape extending in the width direction. The two element connection terminals 41A are disposed in each of the second mounting regions 1B.

The two element connection terminals 41A disposed in each of the second mounting regions 1B consist of a first element connection terminal 41E as one example of a second terminal, and a second element connection terminal 41F. In other words, the first element connection terminal 41E and the second element connection terminal 41F are disposed inside the second mounting region 1B. The first element connection terminal 41E and the second element connection terminal 41F may be also disposed adjacent to the second mounting region 1B.

The first element connection terminal 41E is located at the other side with respect to the recessed portion 20A in the longitudinal direction. The second element connection terminal 41F is located at spaced intervals to the first element connection terminal 41E in the longitudinal direction. The second element connection terminal 41F is located at the opposite side to the first element connection terminal 41E with respect to the recessed portion 20A.

The plurality of (two) power supply terminals 41B are electrically connected to an external power supply 9 in a state where the main body portion 21 is supported by a load beam (not shown).

The plurality of (two) power supply terminals 41B are located in the other end portion of the suspension board with circuit 1 in the longitudinal direction. The plurality of (two) power supply terminals 41B are located at spaced intervals to each other in the width direction. The plurality of (four) external connection terminals 40B are located between the plurality of (two) power supply terminals 41B in the width direction. The power supply terminal 41B has a rectangular shape extending in the longitudinal direction.

The power supply wiring 41C is connected to the first element connection terminal 41E and the power supply terminal 41B, and electrically connects them. The plurality of (two) power supply wirings 41C extend along the longitudinal direction, and are located at spaced intervals to each other in the width direction. The plurality of (four) signal wirings 40C pass between the two power supply wirings 41C in the width direction. Of the two power supply wirings 41C, the power supply wiring 41C at one side in the width direction is disposed at one side at spaced intervals to the read wiring 40D in the width direction. Of the two power supply wirings 41C, the power supply wiring 41C at the other side in the width direction is disposed at the other side at spaced intervals to the write wiring 40E in the width direction.

The ground wiring 41D is connected to the second element connection terminal 41F, and electrically connects the second element connection terminal 41F to the stage 20 (grounded). The plurality of (two) ground wirings 41D are located at spaced intervals to each other in the width direction. The ground wiring 41D extends from the second element connection terminal 41F toward one side in the longitudinal direction. The ground wiring 41D is in contact with the stage 20 via a hole, which is not shown, provided in the base insulating layer 3 (grounded).

The shield wiring pattern 42 is overlapped with the main body portion 21 when viewed from the thickness direction. The shield wiring pattern 42 is located between the power supply wiring 41C and the read wiring 40D. The shield wiring pattern 42 includes an inspection terminal 42A and a shield wiring 42B.

The inspection terminal 42A is provided for continuity inspection of the shield wiring pattern 42. A third probe 12 is brought into contact with the inspection terminal 42A when the continuity inspection of the shield wiring pattern 42 is carried out (ref: FIG. 3C). The inspection terminal 42A is located in one end portion of the shield wiring pattern 42 in the longitudinal direction. The inspection terminal 42A is located in one end portion of the main body portion 21 in the longitudinal direction. The inspection terminal 42A is located on one surface in the thickness direction of the base insulating layer 3. The inspection terminal 42A has a rectangular shape extending in the longitudinal direction.

The shield wiring 42B is connected to the inspection terminal 42A, and electrically connects the inspection terminal 42A to the main body portion 21 (grounded). Thus, the shield wiring pattern 42 is electrically connected to the metal support layer 2.

The shield wiring 42B suppresses a short circuit between the power supply wiring 41C and the read wiring 40D. The shield wiring 42B extends along the longitudinal direction. The shield wiring 42B is disposed between the power supply wiring 41C and the read wiring 40D. The shield wiring 42B is adjacent to the power supply wiring 41C and the read wiring 40D. The shield wiring 42B is located at the opposite side to the write wiring 40E with respect to the read wiring 40D.

As shown in FIG. 3C, the shield wiring 42B has a wiring main body 42C and a ground connecting portion 42D.

The wiring main body 42C is located on one surface in the thickness direction of the base insulating layer 3. One end portion of the wiring main body 42C in the longitudinal direction is connected to the inspection terminal 42A. In other words, the inspection terminal 42A is located in one end portion of the shield wiring 42B in the longitudinal direction. The wiring main body 42C extends from the inspection terminal 42A toward the other side in the longitudinal direction.

The ground connecting portion 42D is located in the other end portion of the shield wiring 42B in the longitudinal direction. The ground connecting portion 42D is electrically connected to the metal support layer 2. More specifically, the ground connecting portion 42D is continuous with the other end portion of the wiring main body 42C in the longitudinal direction. The ground connecting portion 42D fills the ground opening 30, and is in contact with the main body portion 21.

Examples of a material for the conductive layer 4 include conductive materials such as copper. A thickness of the conductive layer 4 is, for example, 1 μm or more, preferably 3 μm or more, and for example, 20 μm or less, preferably 12 μm or less.

1-4. Cover Insulating Layer

As shown in FIGS. 3A to 3C, the cover insulating layer 5 is disposed at one side in the thickness direction of the base insulating layer 3, specifically, on one surface in the thickness direction of the base insulating layer 3 so as to cover the conductive layer 4.

As shown in FIGS. 3A and 3B, the cover insulating layer 5 covers the first wiring pattern 40 so as to expose the plurality of (four) slider connection terminals 40A and the plurality of (four) external connection terminals 40B. Further, the cover insulating layer 5 covers the second wiring pattern 41 so as to expose the plurality of (four) element connection terminals 41A and the plurality of (two) power supply terminals 41B.

As shown in FIG. 3C, the cover insulating layer 5 covers the shield wiring pattern 42 so as to expose the inspection terminal 42A. Specifically, the cover insulating layer 5 has an opening 50. The opening 50 penetrates the cover insulating layer 5 in the thickness direction. The opening 50 exposes one surface in the thickness direction of the inspection terminal 42A.

Thus, one surface in the thickness direction of the slider connection terminal 40A, one surface in the thickness direction of the power supply terminal 41B, one surface in the thickness direction of the element connection terminal 41A, and one surface in the thickness direction of the inspection terminal 42A are exposed from the cover insulating layer 5.

Examples of a material for the cover insulating layer 5 include synthetic resins such as polyimide resin. A thickness of the cover insulating layer 5 is, for example, 1 μm or more, preferably 2 μm or more, and for example, 10 μm or less, preferably 8 μm or less.

2. Continuity Inspection in Suspension Board with Circuit 1

Next, continuity inspection in the suspension board with circuit 1 is described with reference to FIGS. 3A to 3C.

The continuity inspection in the suspension board with circuit 1 inspects at least disconnection and/or a short circuit of the shield wiring 42B. In the present embodiment, the disconnection and/or the short circuit of the signal wiring 40C, the power supply wiring 41C, and the shield wiring 42B are/is collectively inspected using an inspection jig which is not shown.

The inspection jig which is not shown has a first probe 10, a second probe 11, the third probe 12, a plurality of fourth probes which are not shown, a plurality of fifth probes which are not shown, and a sixth probe which is not shown.

As shown in FIG. 3A, the first probe 10 is brought into contact with the slider connection terminal 40A from one side in the thickness direction in the continuity inspection.

As shown in FIG. 3B, the second probe 11 is brought into contact with the first element connection terminal 41E from one side in the thickness direction in the continuity inspection.

As shown in FIG. 3C, the third probe 12 is brought into contact with the inspection terminal 42A from one side in the thickness direction in the continuity inspection. Although not shown, each of the first probe 10, the second probe 11, and the third probe 12 is electrically connected to a voltage detection circuit which is capable of detecting a voltage.

The plurality of fourth probes which are not shown are brought into contact with the plurality of external connection terminals 40B from one side in the thickness direction in the continuity inspection.

The plurality of fifth probes which are not shown are brought into contact with the plurality of power supply terminals 41B from one side in the thickness direction in the continuity inspection.

The sixth probe which is not shown is brought into contact with a portion on which the base insulating layer 3 is not disposed in the metal support layer 2 from one side in the thickness direction in the continuity inspection. Although not shown, each of the fourth probe, the fifth probe, and the sixth probe is electrically connected to a voltage application device which is capable of applying a voltage.

Next, the voltage application device (not shown) applies a voltage to the signal wiring 40C via the fourth probe (not shown) which is in contact with the external connection terminal 40B. Then, the voltage detection circuit (not shown) connected to the first probe 10 inspects disconnection and/or a short circuit of the signal wiring 40C depending on whether or not the voltage is detected.

Further, the voltage application device (not shown) applies a voltage to the power supply wiring 41C via the fifth probe (not shown) which is in contact with the power supply terminal 41B. Then, the voltage detection circuit (not shown) connected to the second probe 11 inspects the disconnection and/or the short circuit of the power supply wiring 41C depending on whether or not the voltage is detected.

The voltage application device (not shown) also applies a voltage to the metal support layer 2 via the sixth probe (not shown) which is in contact with the metal support layer 2. Then, the voltage detection circuit (not shown) which is connected to the third probe 12 inspects the disconnection and/or the short circuit of the shield wiring 42B depending on whether or not the voltage is detected.

As shown in FIG. 1, in the above-described suspension board with circuit 1, the shield wiring pattern 42 is electrically connected to the metal support layer 2, and the shield wiring 42B provided in the shield wiring pattern 42 is disposed between the read wiring 40D and the power supply wiring 41C. Therefore, even when the read wiring 40D and/or the power supply wiring 41C are/is charged, it is possible to suppress the short circuit between the read wiring 40D and the power supply wiring 41C.

In particular, the power supply wiring 41C electrically connected to the piezoelectric element 7 is easily charged as compared with the signal wiring 40C. Then, when the power supply wiring 41C is charged, and the read wiring 40D and the power supply wiring 41C are short-circuited, there is a problem that electrostatic breakdown of the slider 6 occurs. On the other hand, according to the above-described configuration, since the short circuit between the read wiring 40D and the power supply wiring 41C is suppressed, it is possible to suppress the electrostatic breakdown of the slider 6.

As shown in FIG. 3C, the shield wiring pattern 42 has the inspection terminal 42A located in one end portion of the shield wiring 42B, and the ground connecting portion 42D located in the other end portion of the shield wiring 42B. Therefore, it is possible to bring the third probe 12 into contact with the inspection terminal 42A, and carry out the continuity inspection of the shield wiring pattern 42.

As shown in FIGS. 3A to 3C, the slider connection terminal 40A, the first element connection terminal 41E, and the inspection terminal 42A are exposed from the cover insulating layer 5. Therefore, it is possible to bring the probes (the first probe 10, the second probe 11, and the third probe 12) into contact with each of the slider connection terminal 40A, the first element terminal 41E, and the inspection terminal 42A from one side in the thickness direction. As a result, it is possible to collectively carry out the continuity inspection of the first wiring pattern 40, the second wiring pattern 41, and the shield wiring pattern 42.

Second Embodiment

Figure 4:
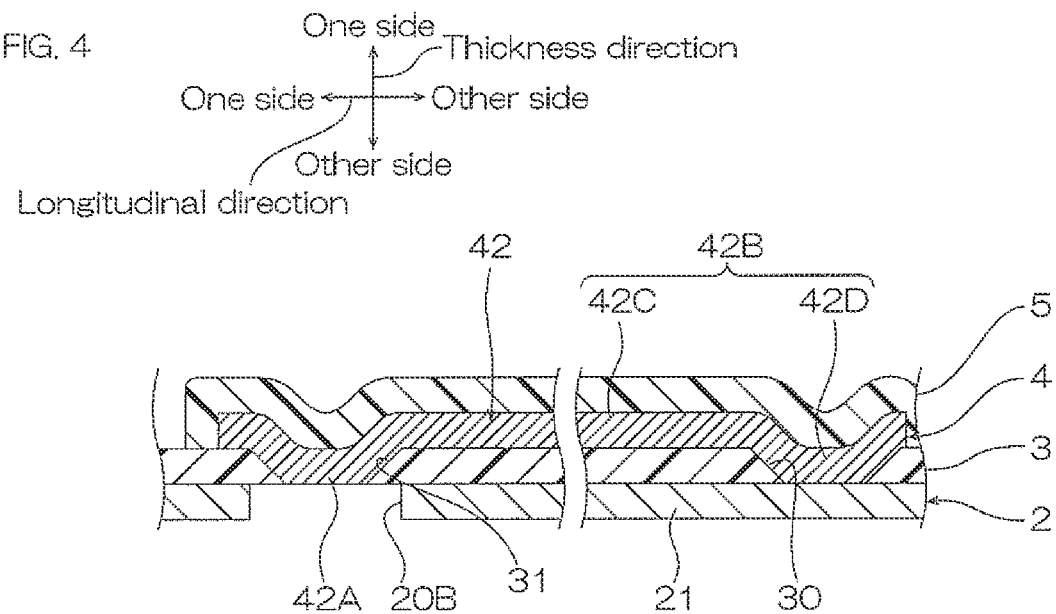
FIG. 4 shows a D-D cross-sectional view of the suspension board with circuit as a second embodiment.

Next, a second embodiment of the wiring circuit board of the present invention is described with reference to FIG. 4. In the second embodiment, the same reference numerals are provided for members corresponding to each of those in the above-described first embodiment, and their detailed description is omitted.

In the first embodiment, the inspection terminal 42A is exposed toward one side in the thickness direction, and the wiring circuit board of the present invention is not limited to this. In the second embodiment, as shown in FIG. 4, the inspection terminal 42A is exposed from the other side in the thickness direction. In this case, the base insulating layer 3 has a first terminal opening 31. The first terminal opening 31 penetrates the base insulating layer 3 in the thickness direction. The metal support layer 2 has a second terminal opening 20B. The second terminal opening 20B penetrates the metal support layer 2 in the thickness direction. The second terminal opening 20B communicates with the first terminal opening 31 in the thickness direction. The inspection terminal 42A fills the first terminal opening 31, and is exposed from the other side in the thickness direction via the second terminal opening 20B.

According to the second embodiment, the same function and effect as that of the first embodiment can be achieved.

Third Embodiment

Next, a third embodiment of the wiring circuit board of the present invention is described with reference to FIG. 5. In the third embodiment, the same reference numerals are provided for members corresponding to each of those in the above-described first embodiment, and their detailed description is omitted.

In the first embodiment, the inspection terminal 42A is located in one end portion of the shield wiring pattern 42 in the longitudinal direction, and the ground connecting portion 42D is located in the other end portion of the shield wiring pattern 42 in the longitudinal direction. However, the arrangement and the number of the inspection terminal 42A, and the arrangement and the number of the ground connecting portion 42D are not limited to this.

Figure 5:
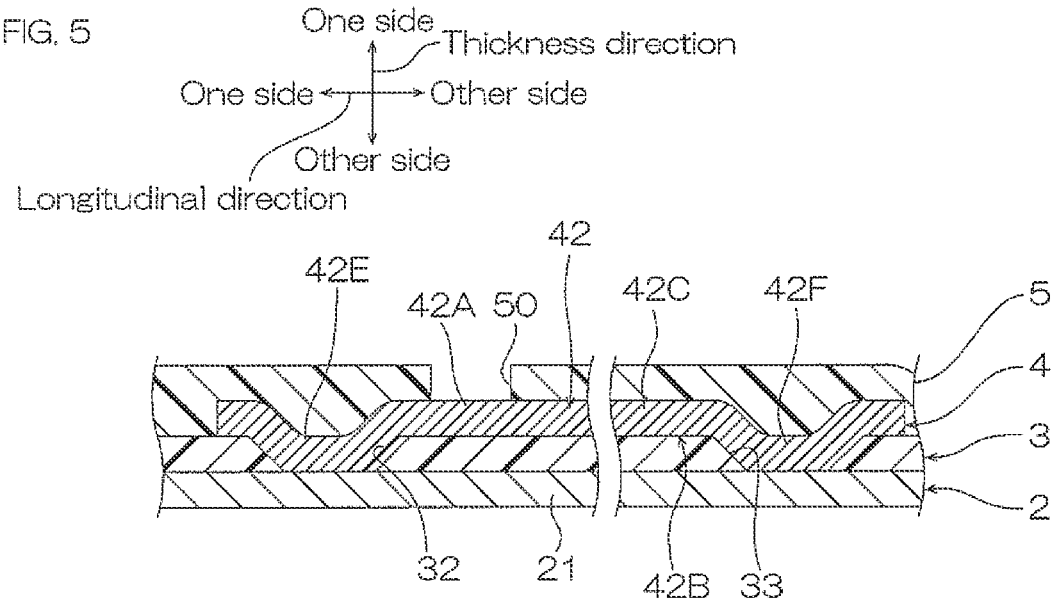
FIG. 5 shows a D-D cross-sectional view of the suspension board with circuit as a third embodiment.

In the third embodiment, as shown in FIG. 5, the shield wiring 42B has the wiring main body 42C, a first ground connecting portion 42E, and a second ground connecting portion 42F.

The first ground connecting portion 42E is located in one end portion of the shield wiring 42B in the longitudinal direction. The second ground connecting portion 42F is located in the other end portion of the shield wiring 42B in the longitudinal direction. More specifically, the first ground connecting portion 42E is continuous with one end portion of the wiring main body 42C in the longitudinal direction. The second ground connecting portion 42F is continuous with the other end portion of the wiring main body 42C in the longitudinal direction.

In this case, the base insulating layer 3 has a first ground opening 32 and a second ground opening 33. Each of the first ground opening 32 and the second ground opening 33 penetrates the base insulating layer 3 in the thickness direction. The first ground opening 32 and the second ground opening 33 are located at spaced intervals to each other in the longitudinal direction. The first ground connecting portion 42E fills the first ground opening 32, and is in contact with the main body portion 21. The second ground connecting portion 42F fills the second ground opening 33, and is in contact with the main body portion 21.

The inspection terminal 42A is provided between the first ground connecting portion 42E and the second ground connecting portion 42F in the shield wiring pattern 42. The inspection terminal 42A is interposed in the middle of the wiring main body 42C in the longitudinal direction (between one end portion and the other end portion).

According to the third embodiment, the same function and effect as that of the first embodiment can be achieved.

Fourth Embodiment

Next, a fourth embodiment of the wiring circuit board of the present invention is described with reference to FIG. 6. In the fourth embodiment, the same reference numerals are provided for members corresponding to each of those in the above-described first embodiment, and their detailed description is omitted.

Figure 6:
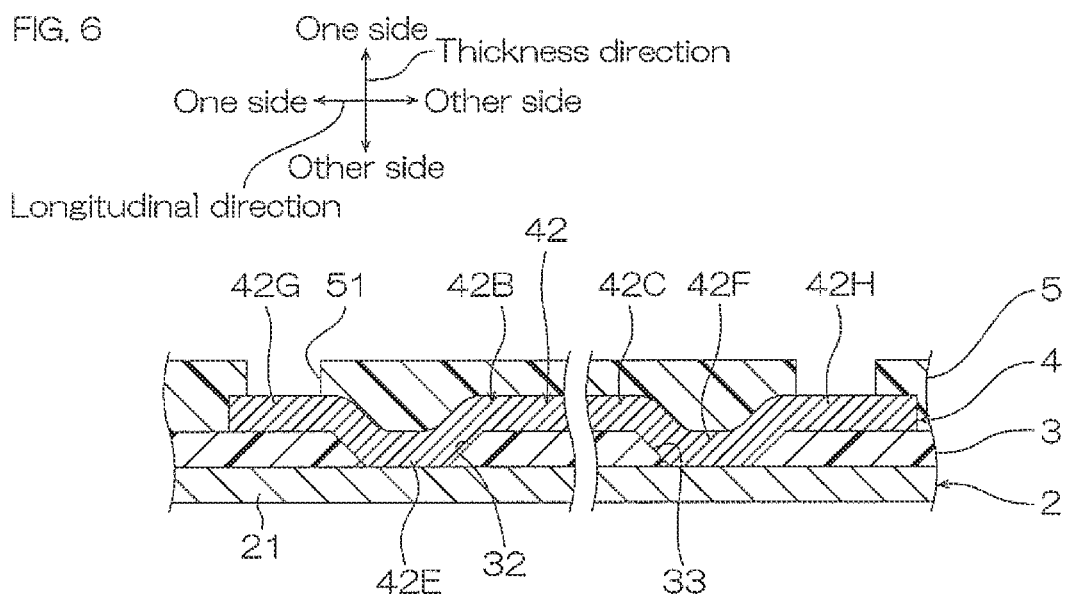
FIG. 6 shows a D-D cross-sectional view of the suspension board with circuit as a fourth embodiment.

In the fourth embodiment, as shown in FIG. 6, the shield wiring pattern 42 includes a first inspection terminal 42G, a second inspection terminal 42H, and the shield wiring 42B.

The first inspection terminal 42G and the second inspection terminal 42H are located at spaced intervals to each other in the longitudinal direction. The first inspection terminal 42G is located in one end portion of the shield wiring pattern 42 in the longitudinal direction. The second inspection terminal 42H is located in the other end portion of the shield wiring pattern 42 in the longitudinal direction.

The shield wiring 42B is located between the first inspection terminal 42G and the second inspection terminal 42H. The shield wiring 42B is connected to the first inspection terminal 42G and the second inspection terminal 42H.

The shield wiring 42B has the wiring main body 42C, the first ground connecting portion 42E, and the second ground connecting portion 42F in the same manner as the third embodiment. Further, the base insulating layer 3 has the first ground opening 32 and the second ground opening 33 in the same manner as the third embodiment.

The first ground connecting portion 42E is continuous with the first inspection terminal 42G. The first ground connecting portion 42E is located at the other side with respect to the first inspection terminal 42G in the longitudinal direction. The second ground connecting portion 42F is continuous with the second inspection terminal 42H. The second ground connecting portion 42F is located at one side with respect to the second inspection terminal 42H in the longitudinal direction.

In this case, the cover insulating layer 5 has a first opening 51 and a second opening 52.

The first opening 51 exposes one surface in the thickness direction of the first inspection terminal 42G. The second opening 52 exposes one surface in the thickness direction of the second inspection terminal 42H.

In the fourth embodiment, though not shown, the continuity inspection is carried out in a state where the third probe 12 (ref: FIG. 3C) is in contact with the first inspection terminal 42G, and the sixth probe which is not shown is in contact with the second inspection terminal 42H.

According to the fourth embodiment, the same function and effect as that of the first embodiment can be achieved.

Fifth Embodiment

Next, a fifth embodiment of the wiring circuit board of the present invention is described with reference to FIG. 7. In the fifth embodiment, the same reference numerals are provided for members corresponding to each of those in the above-described first embodiment, and their detailed description is omitted.

In the first embodiment, the shield wiring pattern 42 includes the inspection terminal 42A, and the ground connecting portion 42D separately. However, the present invention is not limited to this. The inspection terminal may also serve as a ground connecting portion.

Figure 7:
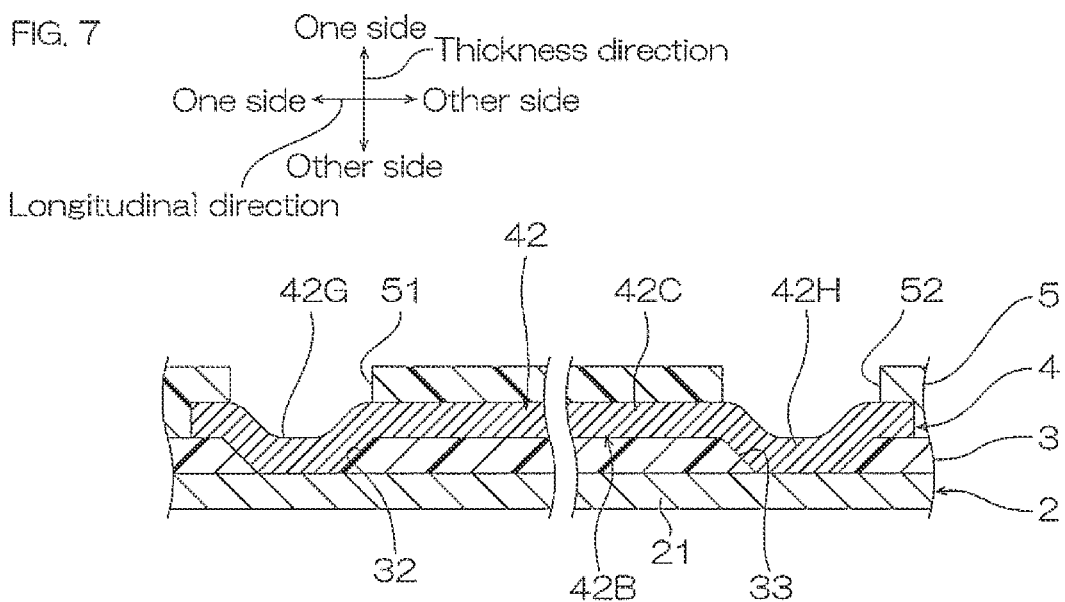
FIG. 7 shows a D-D cross-sectional view of the suspension board with circuit as a fifth embodiment.

In the fifth embodiment, as shown in FIG. 7, the shield wiring pattern 42 includes the first inspection terminal 42G and the second inspection terminal 42H in the same manner as the fourth embodiment. The first inspection terminal 42G also serves as a first ground connecting portion, and the second inspection terminal 42H also serves as a second ground connecting portion. In this case, the base insulating layer 3 has the first ground opening 32 and the second ground opening 33, and the cover insulating layer 5 has the first opening 51 and the second opening 52 in the same manner as the fourth embodiment.

The first inspection terminal 42G is continuous with one end portion of the wiring main body 42C in the longitudinal direction. The first inspection terminal 42G fills the first ground opening 32, and is in contact with the main body portion 21. The second inspection terminal 42H is continuous with the other end portion of the wiring main body 42C in the longitudinal direction. The second inspection terminal 42H fills the second ground opening 33, and is in contact with the main body portion 21.

According to the fifth embodiment, the same function and effect as that of the first embodiment can be achieved.

Modified Examples

In the above-described first to fifth embodiments, the shield wiring 42B is adjacent to the power supply wiring 41C and the read wiring 40D. However, the wiring circuit board of the present invention is not limited to this. For example, another wiring may be also disposed between the shield wiring 42B and the read wiring 40D.

In the above-described first to fifth embodiments, the suspension board with circuit 1 is used as one example of a wiring circuit board. However, the wiring circuit board is not limited to the suspension board with circuit 1. The wiring circuit board may be also a flexible printed wiring board with a reinforcing layer including the metal support layer 2 as a reinforcing layer.

Each modified example can achieve the same function and effect as that of the above-described first embodiment.

Furthermore, the first to fifth embodiments and the modified examples can be appropriately used in combination.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is, for example, used for various applications such as wiring circuit boards for an electronic device (wiring circuit board for an electronic component), wiring circuit boards for an electrical device (wiring circuit board for an electrical component), and the like.

DESCRIPTION OF REFERENCE NUMERALS

1 Suspension board with circuit
1A First mounting region
1B Second mounting region
2 Metal support layer
3 Base insulating layer
4 Conductive layer
40 First wiring pattern
40A Slider connection terminal
40D Read wiring
41 Second wiring pattern
41E First element connection terminal
42 Shield wiring pattern
42A Inspection terminal
42B Shield wiring
42D Ground connecting portion
42E First ground connecting portion
42F Second ground connecting portion
42G First inspection terminal
42H Second inspection terminal
5 Cover insulating layer
6 Slider
7 Piezoelectric element

The invention claimed is:

1. A wiring circuit board comprising:
a first mounting region for mounting a first electronic element and a second mounting region for mounting a second electronic element, the wiring circuit board comprising:
a metal support layer,
a base insulating layer disposed at one side in a thickness direction of the metal support layer, and
a conductive layer disposed at one side in the thickness direction of the base insulating layer, wherein
the conductive layer includes
a first wiring pattern having a first terminal disposed inside or adjacent to the first mounting region, and a first wiring connected to the first terminal;
a second wiring pattern having a second terminal disposed inside or adjacent to the second mounting region, and a second wiring connected to the second terminal and disposed at spaced intervals to the first wiring; and
a shield wiring pattern electrically connected to the metal support layer, and
the shield wiring pattern includes a shield wiring disposed between the first wiring and the second wiring.

2. The wiring circuit board according to claim 1, wherein the shield wiring pattern has
an inspection terminal for continuity inspection, and
a ground connecting portion electrically connected to the metal support layer.

3. The wiring circuit board according to claim 2, wherein
at least one of the inspection terminal and the ground connecting portion is located in an end portion of the shield wiring.

4. The wiring circuit board according to claim 2 further comprising:
a cover insulating layer disposed at one side in the thickness direction of the base insulating layer and covering the conductive layer, wherein
the first terminal, the second terminal, and the inspection terminal are exposed from the cover insulating layer.

* * * * *